(12) United States Patent
Kagoshima

(10) Patent No.: US 11,917,766 B2
(45) Date of Patent: Feb. 27, 2024

(54) SUBSTRATE WORK MACHINE

(71) Applicant: FUJI CORPORATION, Chiryu (JP)

(72) Inventor: Hiroyuki Kagoshima, Kariya (JP)

(73) Assignee: FUJI CORPORATION, Chiryu (JP)

( * ) Notice: Subject to any disclaimer, the term of this patent is extended or adjusted under 35 U.S.C. 154(b) by 60 days.

(21) Appl. No.: 17/611,631

(22) PCT Filed: Jun. 6, 2019

(86) PCT No.: PCT/JP2019/022562
§ 371 (c)(1),
(2) Date: Nov. 16, 2021

(87) PCT Pub. No.: WO2020/245985
PCT Pub. Date: Dec. 10, 2020

(65) Prior Publication Data
US 2022/0248577 A1 Aug. 4, 2022

(51) Int. Cl.
*B23P 19/00* (2006.01)
*G11C 5/12* (2006.01)
*H05K 13/00* (2006.01)
*H05K 13/08* (2006.01)

(52) U.S. Cl.
CPC ..... *H05K 13/0812* (2018.08); *H05K 13/0069* (2013.01)

(58) Field of Classification Search
CPC ........... H05K 13/0069; H05K 13/0812; H05K 13/083
See application file for complete search history.

(56) References Cited

U.S. PATENT DOCUMENTS

| 9,511,455 | B2* | 12/2016 | Okuda | G01N 21/956 |
| 11,212,950 | B2* | 12/2021 | Takehara | G06T 11/60 |
| 2004/0190034 | A1* | 9/2004 | Ozawa | H04N 21/435 |
| | | | | 358/1.15 |
| 2007/0073428 | A1 | 3/2007 | Oohashi et al. | |

FOREIGN PATENT DOCUMENTS

JP 2008-211051 A 9/2008
WO WO 2004/103054 A1 11/2004

OTHER PUBLICATIONS

International Search Report dated Sep. 3, 2019 in PCT/JP2019/022562 filed on Jun. 6, 2019 (4 pages).

* cited by examiner

*Primary Examiner* — Paul D Kim
(74) *Attorney, Agent, or Firm* — Oblon, McClelland, Maier & Neustadt, L.L.P.

(57) ABSTRACT

A board work machine includes a backup plate, a backup member disposed on the backup plate to support a board from below, a movement device configured to move the backup member, a movement control section configured to control an operation of the movement device based on a position program indicating a position of the backup member disposed on the backup plate, a display section configured to display the position of the backup member indicated by the position program in a superimposed manner on a board image indicating the board, and an editing section configured to edit the position program in response to a request for increasing or decreasing the number of the backup members and changing the position of the backup member from an operator.

16 Claims, 9 Drawing Sheets

POSITION PROGRAM M1

| ID | BACKUP POSITION | PIN TYPE | PIN POSITION |
|---|---|---|---|
| Pfa001 | P1(X1, Y1) | Tp-A | X1, Y1 |
| Pfa002 | P2(X2, Y2) | Tp-A | X2, Y2 |
| Pfa003 | P3(X3, Y3) | Tp-A | X3, Y3 |
| Pfb001 | P4(X4, Y4) | Tp-B | X41, Y41 |
| Pfb002 | NOT USED | Tp-B | NOT USED |
| : | : | : | : |

Fig. 8

WORK EVALUATION DATA Hv

BOARD CONVEYANCE PROCESS

| BOARD TYPE | NUMBER OF TIMES OF EXECUTION | XY ERROR | ANGLE ERROR | STANDARD DEVIATION |
|---|---|---|---|---|
| Tc-A | Na | HEa | REa | DSa |
| Tc-B | Nb | HEb | REb | DSb |
| Tc-C | Nc | HEc | REc | DSc |
| ⋮ | ⋮ | ⋮ | ⋮ | ⋮ |

} Hs

MOUNTING PROCESS (PRODUCT TYPE: Tc-A)  — Dt

| | ZONE D1 | ZONE D2 | ZONE D3 | ZONE D4 |
|---|---|---|---|---|
| NUMBER OF ERROR | n11/M | n12/M | n13/M | n14/M |
| OCCURRENCE RATIO | 0.0a (%) | 0.0b (%) | 0.0c (%) | 0.0d (%) |
| MOUNTING ACCURACY | Fa11 | Fa12 | Fa13 | Fa14 |

} Hs

MOUNTING PROCESS (PRODUCT TYPE: Tc-B)

| | ZONE D1 | ZONE D2 | ZONE D3 | ZONE D4 |
|---|---|---|---|---|
| NUMBER OF ERROR | n21/M | n22/M | n23/M | n24/M |
| OCCURRENCE RATIO | 0.0e (%) | 0.0f (%) | 0.0g (%) | 0.0h (%) |
| MOUNTING ACCURACY | Fa21 | Fa22 | Fa23 | Fa24 |

} Hs

SUBSTRATE WORK MACHINE

TECHNICAL FIELD

The present disclosure relates to a board work machine.

BACKGROUND ART

A board work machine is used to produce board products. Patent Literature 1 discloses a component mounter for mounting a component on a board as predetermined board work. Such a component mounter positions a board conveyed into the mounter, and supports the board by contacting a backup member with the board from below. The above backup member is disposed based on a position program (corresponding to backup pin coordinate data illustrated in FIG. 10 in Patent Literature 1) generated in accordance with board work scheduled to be executed, the type of the board, and a state of a bottom surface of the board (a lower surface of the positioned board).

PATENT LITERATURE

Patent Literature 1: International Publication No. 2004/103054

BRIEF SUMMARY

Technical Problem

Here, when the position program is edited in the board work machine, there is concern that interference between a component mounted on the bottom surface and the backup member occurs. Therefore, editing of the position program in the board work machine is generally prohibited in principle. On the other hand, for example, when predetermined board work is executed multiple times, editing of position program may be required based on the tendency of a work result. However, even if the editing of the position program is permitted, since an operator cannot visually recognize the bottom surface of the positioned board, it is not easy to perform an appropriate adjustment process on the backup member.

In a case where predetermined board work is executed multiple times, for example, even if a similar error occurs multiple times, it is difficult to determine whether the error is solved by performing the process of adjusting a position of the backup member. In order to maintain suitable production by the board work machine, it is desirable that the necessity of a process of adjusting a position of a backup member is accurately determined while coping with a variable production environment.

A first object of the present specification is to provide board work that can allow editing of a position program such that a process of adjusting a position of a backup member is appropriately executed. A second object of the present specification is to provide a board work machine capable of more accurately determining the necessity of a process of adjusting a position of a backup member.

Solution to Problem

The present specification discloses a first board work machine including a backup plate; a backup member disposed on the backup plate to support a board from below; a movement device configured to move the backup member; a movement control section configured to control an operation of the movement device based on a position program indicating a position of the backup member disposed on the backup plate; a display section configured to display the position of the backup member indicated by the position program in a superimposed manner on a board image indicating the board; and an editing section configured to edit the position program in response to a request for increasing or decreasing the number of the backup members and changing the position of the backup member from an operator.

The present specification discloses a second board work machine including a backup plate; a backup member disposed on the backup plate to support a board from below; a movement device configured to move the backup member; a movement control section configured to control an operation of the movement device based on a position program indicating a position of the backup member disposed on the backup plate; and a determination section configured to determine whether an adjustment process including an increase or a decrease of the number of the backup members and a change of the position of the backup member is necessary based on work evaluation data related to execution of predetermined board work.

Advantageous Effects

According to the configuration of the first board work machine, an operator can give an instruction for adjusting the backup member while referring to the board image on which the position of the backup member is displayed in a superimposed manner. Therefore, the board work machine can allow editing of the position program such that a process of adjusting a position of the backup member is appropriately executed.

According to the configuration of the second board work machine, it is possible to determine whether a process of adjusting position of the backup member is necessary based on the work evaluation data related to execution of board work. Consequently, it is possible to reliably execute a necessary adjustment process, and thus to improve the accuracy and efficiency of the board work. It is possible to prevent an unnecessary adjustment process from being executed and thus to prevent degradation in productivity.

BRIEF DESCRIPTION OF DRAWINGS

FIG. 8 is a diagram illustrating work evaluation data.

DESCRIPTION OF EMBODIMENTS

Hereinafter, embodiments of a board work machine will be described with reference to the drawings. The board work machine executes predetermined board work in order to produce various board products. As an example, the board work machine forms a production line for producing a board product. The production line includes, for example, a printing machine that prints solder on a board, a component mounter that mounts a component on the board, a reflow furnace that heats the board to perform soldering, and an inspection machine that inspects a function and an appearance of a board product.

A configuration of the production line may be added or changed as appropriate according to the type of board product to be produced or the like. Specifically, a board work machine such as a buffer device that temporarily holds a board to be conveyed, a board supplying device, a board flipping device, a shield mounting device, an adhesive application device, or an ultraviolet ray irradiation device may be installed as appropriate in the production line. The configuration exemplified in the present embodiment is applicable to a board work machine that supports a board by using a backup member during execution of predetermined board work. Hereinafter, a configuration capable of allowing editing of a position program or a configuration capable of determining whether a process of adjusting a position of a backup member is necessary will be exemplified as an aspect applied to a component mounter serving as a board work machine.

1. Configuration of Component Mounter 1

Figure 1:
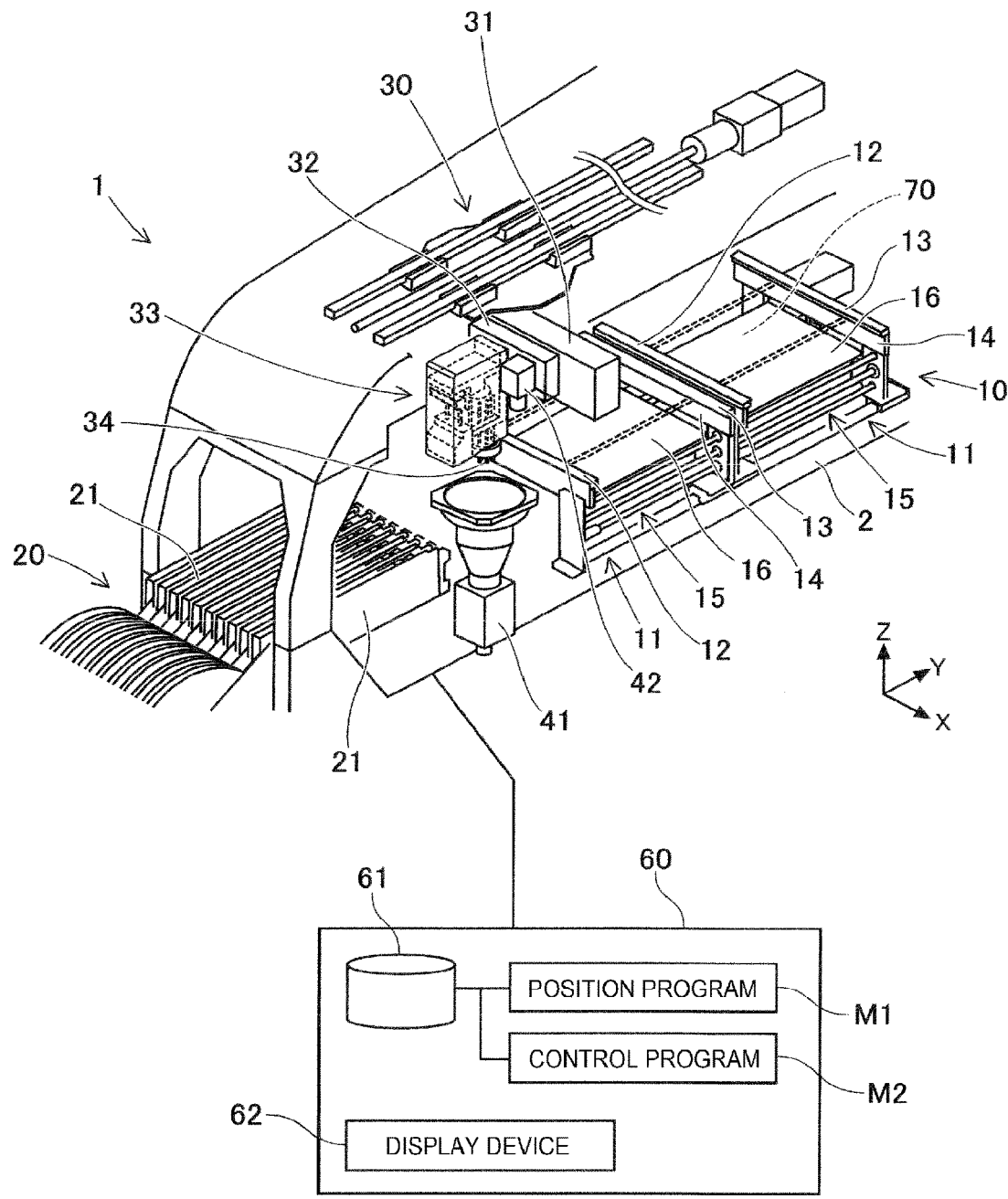
FIG. 1 is a perspective view illustrating a component mounter in an embodiment.

As illustrated in FIG. 1, component mounter 1 includes board conveyance device 10, component supply device 20, component transfer device 30, component camera 41, board camera 42, and control device 60. In the following description, the front-rear direction of component mounter 1 (a direction from the lower left to the upper right in FIG. 1) that is a horizontal direction is set to a Y direction, a left-right direction of component mounter 1 (a direction from the upper left to the lower right in FIG. 1) that is a horizontal direction intersecting the Y direction is set to an X direction, and a vertical direction (an up-down direction in FIG. 1) orthogonal to the X direction and the Y direction is set to a Z direction.

Board conveyance device 10 is configured with multiple conveyance mechanisms 11 or the like installed to be arranged in the Y direction. Each of multiple conveyance mechanisms 11 includes a pair of guide rails 12 and 13, and conveyor belt 14. The pair of guide rails 12 and 13 extend in a conveyance direction (X direction) of a board, and support a peripheral edge of board 70 placed and conveyed on conveyor belt 14. At least one of the pair of guide rails 12 and 13 is provided on base 2 so as to be movable in the Y direction.

Board conveyance device 10 sequentially conveys board 70 in the conveyance direction, and positions board 70 at a predetermined position in the machine.

Board conveyance device 10 includes backup device 15 that clamps positioned board 70. Detailed configurations of board conveyance device 10 and backup device 15 will be described later. After executing the component mounting process, board conveyance device 10 conveys out board 70 to the outside of component mounter 1.

Component supply device 20 supplies components to be mounted on board 70. Component supply device 20 includes feeders 21 set to be arranged in X direction. Feeder 21 feeds and moves a carrier tape in which multiple components are housed, so that the components are supplied to be picked up. Component supply device 20 may supply, for example, relatively large components in a state in which the components are arranged on a tray placed on a pallet. In the above configuration, component supply device 20 supplies components by pulling out predetermined pallets from a housing device that houses multiple pallets in accordance with a mounting process.

Component transfer device 30 transfers the component supplied by component supply device 20 to a predetermined mounting position on board 70 conveyed into the machine by board conveyance device 10. Head driving device 31 of component transfer device 30 moves moving table 32 in the horizontal direction (the X direction and the Y direction) with a linear motion mechanism. Mounting head 33 is fixed to moving table 32 in an exchangeable manner by a clamp member (not illustrated). Various holding members are detachably attached to mounting head 33. The holding member holds a component or backup member 50 (refer to FIG. 2) that will be described later.

The suction nozzle 34 picks up and holds a component by using supplied negative pressure air. A chuck that clamps a component may be attached to mounting head 33. A holding member that holds backup member 50 may be attached to mounting head 33, for example, by being engaged with a predetermined portion of backup member 50. As described above, component transfer device 30 is configured to be capable of holding backup member 50, and functions as a movement device that moves backup member 50. Component transfer device 30 is used for an arrangement process for backup member 50 and an adjustment process after the disposition (increase or decrease and change of the position).

Component camera 41 and board camera 42 are digital imaging devices each having an imaging element such as a CMOS. Component camera 41 and board camera 42 perform imaging based on a control signal and transmit image data acquired through the imaging. Component camera 41 is configured to be capable of imaging a component held by suction nozzle 34 of mounting head 33 from below. Board camera 42 is provided on moving table 32, and is moved integrally with mounting head 33 in accordance with movement of moving table 32. Board camera 42 is configured to be capable of imaging board 70 from above.

Control device 60 is mainly configured with a CPU, various types of memories, and a control circuit. Control device 60 executes a mounting process of mounting a component on board 70. In the mounting process, control device 60 controls an operation of component transfer device 30 based on information output from various sensors, a result of image processing, control program M2 stored in advance, and the like. Thus, positions and angles of multiple suction nozzles 34 supported by mounting head 33 are controlled. Control device 60 executes an adjustment process including addition or removal of backup member 50 used for board conveyance device 10 to support board 70 from below in the mounting process, and changing of a position of backup member 50.

Figures 2, 3:
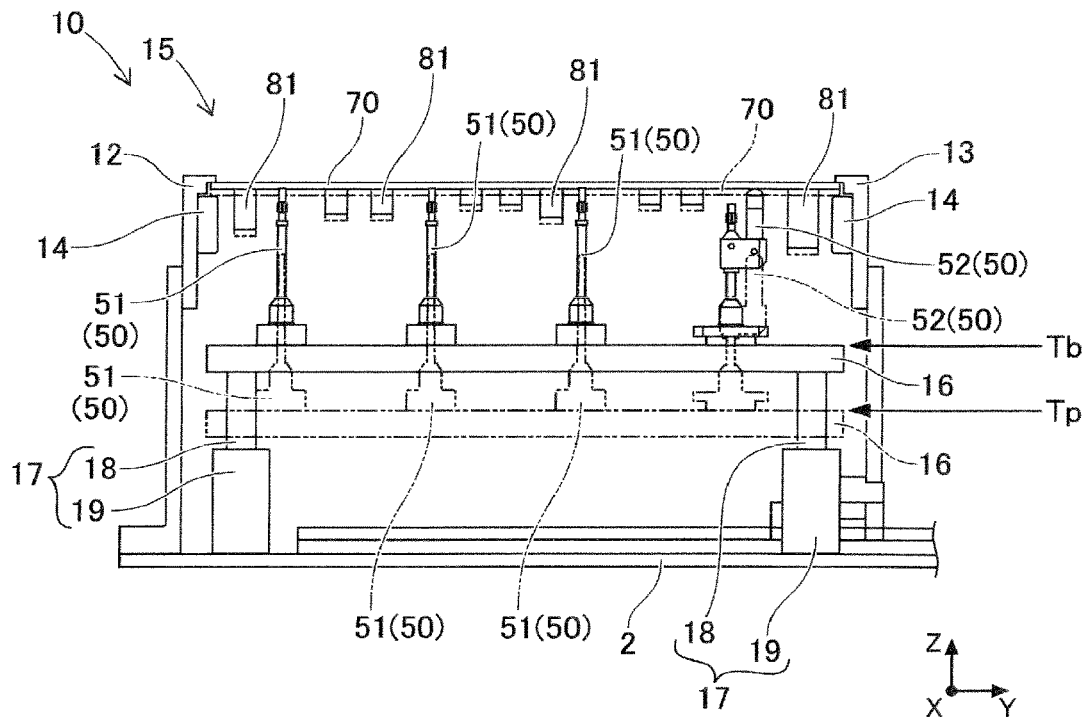
FIG. 2 is a side view illustrating a backup device of a board conveyance device.
FIG. 3 a diagram illustrating a position program.

As illustrated in FIG. 1, control device 60 includes storage device 61. Storage device 61 is configured with an optical drive device such as a hard disk device, a flash memory, or the like. Various data such as position program M1 and control program M2 are stored in storage device 61. As illustrated in FIG. 3, "position program M1" indicates a backup position with respect to board 70, the type (pin type) of backup member 50, a position (pin position) at which backup member 50 is to be disposed, and the like, and is set according to the type of board product to be produced and a production step.

A difference between the "backup position" and the "pin position" described above is a case where a contact portion (corresponding to the backup position) with board 70 in backup member 50 and a reference portion related to a disposition (for example, a portion to be held and corresponding to the pin position) are deviated in the XY direction. "Control program M2" indicates a mounting position and a mounting order of a component to be mounted on board 70 in the mounting process.

Control device 60 includes display device 62. Display device 62 is provided to be visually recognizable by an operator, and displays various information. In the present embodiment, display device 62 has a touch screen and multiple buttons, and receives an operation from the operator in cooperation with an input device such as a mouse (not illustrated).

2. Detailed Configurations of Board Conveyance Device 10 and Backup Device 15

Board conveyance device 10 is a double track conveyor system including multiple conveyance mechanisms 11 as described above. The pair of guide rails 12 and 13 configuring conveyance mechanisms 11 are provided on base 2 so as to be relatively movable in the Y direction. Consequently, multiple conveyance mechanisms 11 adjust a gap between the pair of guide rails 12 and 13 in accordance with dimensions of board 70 in the Y direction.

Backup device 15 supports board 70 conveyed by conveyance mechanisms 11 from below, and clamps board 70 between the pair of guide rails 12 and 13. In the present embodiment, backup device 15 supports board 70 by contacting backup member 50 with a lower surface of board 70. Consequently, backup device 15 clamps board 70 between the pair of guide rails 12 and 13, and maintains a height of the portion where backup member 50 contacts board 70 to prevent board 70 from bending.

As illustrated in FIG. 2, backup device 15 includes backup plate 16 and lifting and lowering device 17. Backup plate 16 is disposed to face the lower surface of board 70 positioned by conveyance mechanisms 11. Backup plate 16 is provided on base 2 to be movable up and down in the Z direction. In the present embodiment, backup plate 16 is formed in a rectangular shape. Backup member 50 is detachably disposed on an upper surface of backup plate 16.

Lifting and lowering device 17 moves up and down backup plate 16 with respect to base 2. In the present embodiment, lifting and lowering device 17 is configured with multiple air cylinders each having rod 18 and cylinder main body 19. Rods 18 of the respective air cylinders are detachably fixed to the four corners of backup plate 16. Cylinder main body 19 of each air cylinder advances and retracts rod 18 in the Z direction in accordance with the air pressure.

Lifting and lowering device 17 of backup device 15 retracts backup member 50 downward from the bottom surface of board 70 when board 70 is conveyed in or out. Consequently, lifting and lowering device 17 moves down backup plate 16 to preparation height Tp at which a component (hereinafter, referred to as "bottom surface component 81") mounted on the bottom surface of board 70 and backup member 50 do not interfere with each other (indicated by a two-dot chain line in FIG. 2). Lifting and lowering device 17 moves up backup plate 16 to backup height Tb (indicated by a solid line in FIG. 2) during execution of the mounting process. Consequently, backup device 15 pushes up and supports board 70 from below.

Here, backup member 50 is detachably disposed on the upper surface of backup plate 16. In the present embodiment, backup member 50 includes hard pin 51 having a distal end part formed of a relatively hard member (for example, a metal member), and soft pin 52 having a distal end portion formed of a relatively soft member (for example, a rubber member). Hard pin 51 and soft pin 52 are fixed to backup plate 16 having a magnet embedded in a base section located at a lower end thereof and having a good magnetic force. Hard pin 51 and soft pin 52 are formed with engagement portions having the same shape above the base section. The engagement portion is engaged with a holding member attached to mounting head 33.

3. Outline of Arrangement Process for Backup Member 50

Control device 60 of component mounter 1 executes, for example, an arrangement process for backup member 50 based on position program M1 by using component transfer device 30 functioning as a movement device of backup member 50 before executing a mounting process corresponding to a predetermined board product. The purpose of executing the arrangement process is to handle, for example, the type of backup member 50 and a position where backup member 50 is to be disposed that may change according to dimensions of a board or the number or positions of components to be mounted.

In a case where board 70 has a large dimension and there is concern that the board will bend due to a relatively strong pressing force applied to the board at the time of mounting, hard pin 51 capable of minimizing the displacement of a supported portion on the lower surface of the board is suitable as backup member 50. On the other hand, in a case where a component is already mounted on the lower surface of the board supported by backup member 50 in the mounting process in a pre-step, soft pin 52 capable of absorbing and supporting the unevenness of the lower surface of the board is suitable as backup member 50.

Therefore, component mounter 1 changes a disposition of backup member 50 as necessary as one of setups when the type of board product to be produced is changed. In addition to fixing backup member 50 to backup plate 16 located below board 70, the change of the disposition includes removing backup member 50 (moving backup member 50 to a stock region not used to support board 70).

Control device 60 attaches the holding member of backup member 50 to mounting head 33 when executing the arrangement process for backup member 50. The above-described holding member is accommodated in, for example, a nozzle station (not illustrated) accommodating multiple suction nozzles 34, and is replaced with suction nozzles 34 attached to mounting head 33. Control device 60 drives component transfer device 30 to appropriately move a target backup member 50 to a position indicated by position program M1. After the disposition of all backup members 50 is completed, control device 60 accommodates the holding member in the nozzle station, and finishes the arrangement process. Control device 60 stores the current positions of all backup members 50 including the stock region in storage device 61.

4. Detailed Configuration of Control Device 60

4-1. Outline of First Aspect

Here, position program M1 used in the arrangement process for backup member 50 as described above is set in advance so as to be suitable for the mounting process scheduled to be executed. However, when the same mounting process is repeatedly performed, a request for adjusting a disposition of backup member 50 may be made based on the tendency of a work result. Specifically, it is assumed that bending of board 70 is larger than supposed, or that a similar deviation occurs in many of boards 70 to be positioned.

The work result as described above is often recognized by an operator at a site who performs maintenance of component mounter 1 executing the mounting process. However, adjustment of the disposition of backup member 50 by the operator at the site corresponds to editing of position program M1. For example, when adjustment corresponding to only the tendency of the work result is performed, there is concern that a component already mounted on the bottom surface and backup member 50 may interfere with each other, or the backup position is set at a portion such as a land where contact with backup member 50 is required to be avoided. Thus, from the viewpoint of managing a production line, it is desirable to prohibit the editing of position program M1 at a site for a mounting process.

On the other hand, if a manager is notified of the tendency of the work result and requested to edit position program Mt it takes time until edited position program M1 is applied. Thus, from the viewpoint of the convenience of an operator at the site or the maintenance of productivity, it is desirable that position adjustment of backup member 50 is permitted. However, even if the editing of position program M1 at the site is permitted, it is not easy for the operator to set appropriately the specific position to dispose backup member 50 to be added, for example, since the operator cannot visually recognize the bottom surface of board 70.

Figure 4:
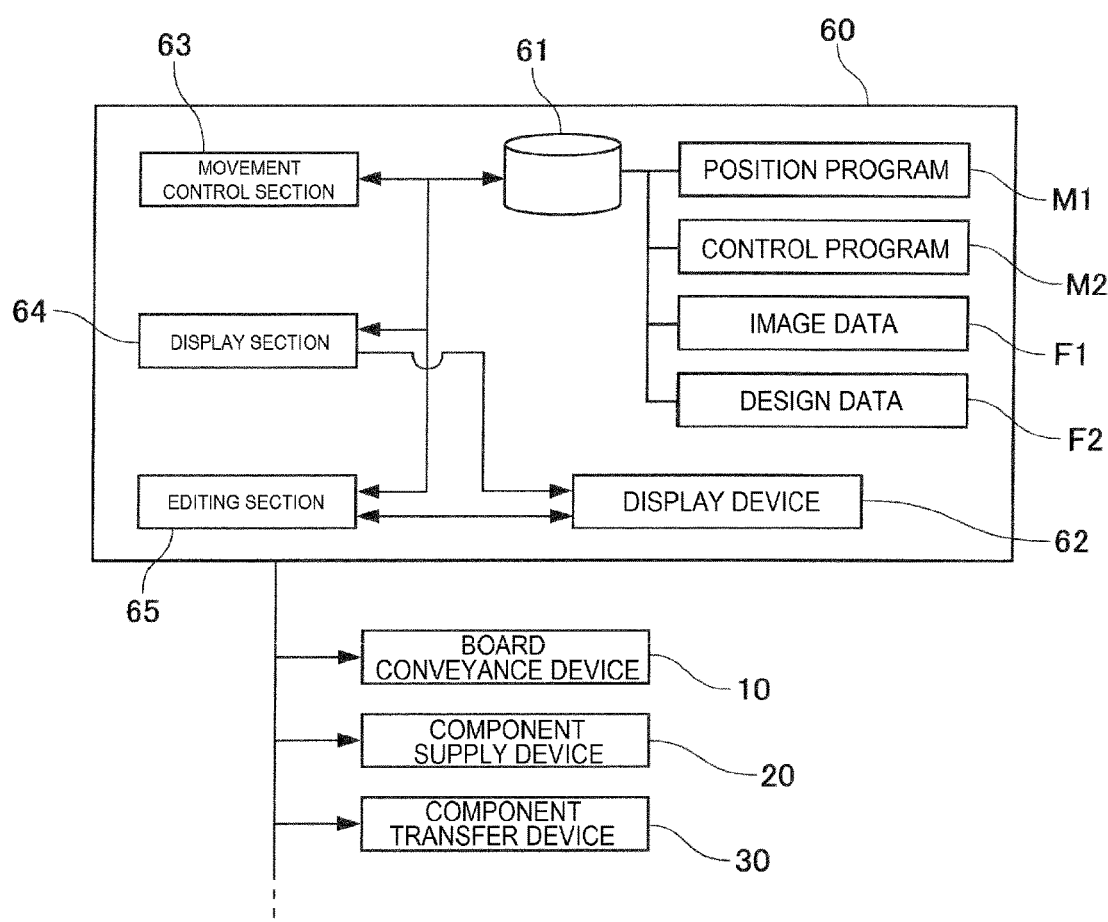
FIG. 4 is a block diagram illustrating a control device of a component mounter in a first aspect.

Therefore, in the first aspect of the present embodiment, component mounter 1 employs a configuration of receiving editing of position program M1 (adjustment of a position of backup member 50) on the premise that predetermined information is displayed to the operator. Specifically, as illustrated in FIG. 4, component mounter 1 includes movement control section 63, display section 64, and editing section 65. In the first aspect, movement control section 63, display section 64, and editing section 65 are incorporated into control device 60.

4-1-1. Movement Control Section 63

Movement control section 63 controls an operation of a movement device (component transfer device 30) based on position program M1. Movement control section 63 controls an operation of component transfer device 30 in the arrangement process and the adjustment process for backup member 50. When position program M1 is edited by editing section 65 that will be described later, movement control section 63 executes a necessary adjustment process based on a difference between a position of backup member 50 indicated by the edited position program M1 and the current position of backup member 50 stored in storage device 61.

4-1-2. Display Section 64

Figure 5:
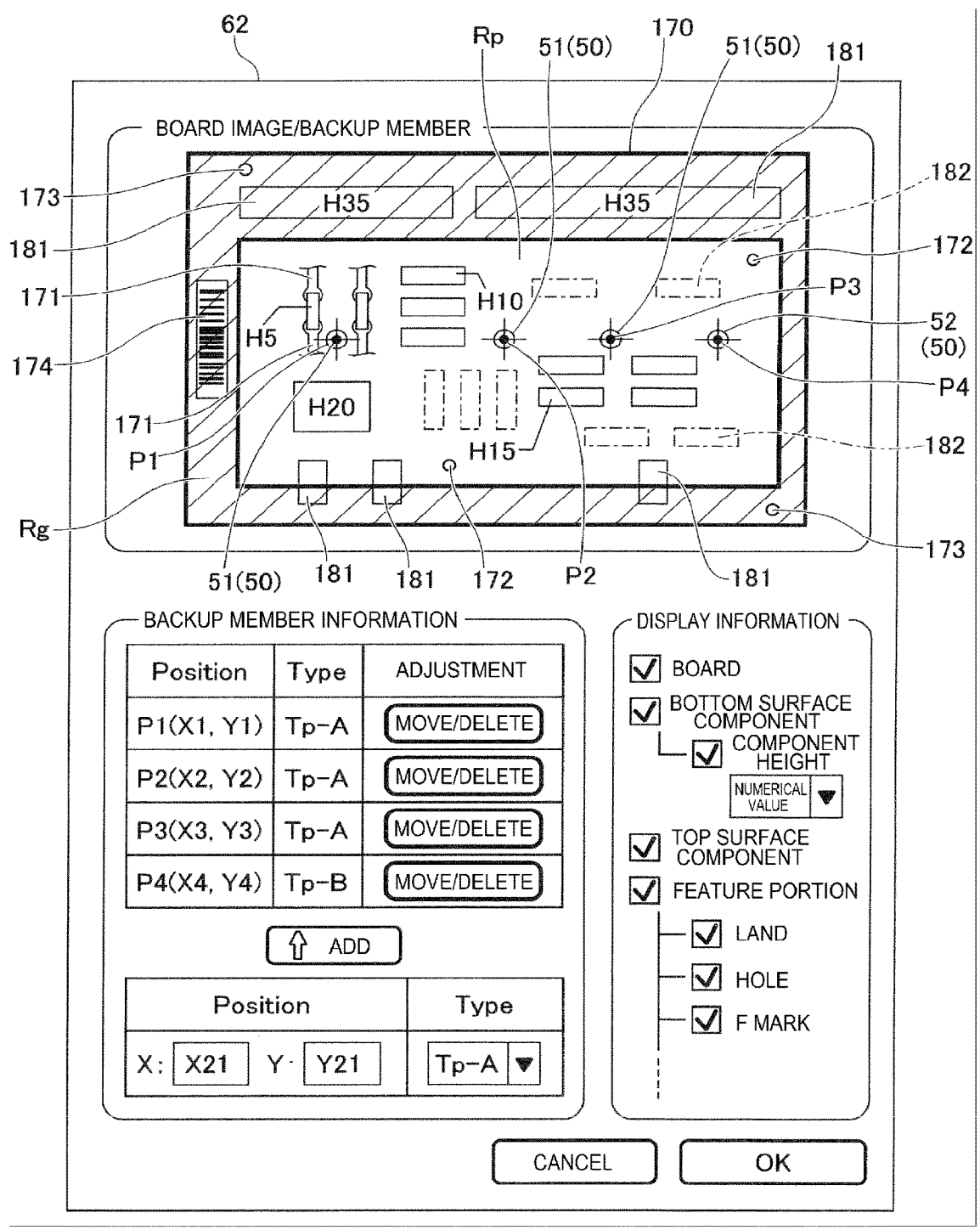
FIG. 5 is a diagram illustrating various information including a board image displayed on a display device of the control device.

As illustrated in FIG. 5, display section 64 displays positions of backup members 50 (backup positions P1 to P4) indicated by position program M1 in a superimposed manner on board image 170 indicating board 70. Display section 64 may switch between display and non-display of various display information as described below. In the first aspect, display section 64 displays information related to an item that an operator has requested, as illustrated in the lower right part of FIG. 5, by checking the item to be displayed on board image 170 in a superimposed manner.

Display section 64 may display bottom surface component image 181 that indicates a component (bottom surface component 81) mounted on the bottom surface of board 70 in a superimposed manner on board image 170. Display section 64 may display only an outer shape of bottom surface component image 181, or may additionally display an orientation or a predetermined feature portion of bottom surface component 81. These display targets may be set in advance, or may switch between display and non-display in accordance with a request from an operator.

Display section 64 may display a height of a component (bottom surface component 81) mounted on the bottom surface of board 70 in board image 170 by using at least one of a numerical value, a color, and a pattern. In FIG. 5, heights (H5, H10, H15, and H35) of bottom surface component 81 are indicated according to an aspect such as a "numerical value" selected by the operator. In addition to the above, display section 64 may display a height of bottom surface component 81 by changing shading of colors in accordance with the height or by using a pattern, a symbol, or a combination thereof. With this configuration, the operator can understand the height of bottom surface component 81. Consequently, for example, backup member 50 can be disposed at a position where preparation height Tp is as high as possible.

Here, board image 170 and bottom surface component image 181 may be images generated based on image data F1 acquired by imaging board 70 after components are mounted on board 70. Specifically, after bottom surface component 81 is mounted in a state in which the bottom surface of board 70 is turned to become the upper surface, the upper surface of board 70 at this time is imaged, and image data F1 is acquired through the imaging. Acquired image data F1 is stored in storage device 61 of control device 60.

The above-described image data F1 may be acquired, for example, through imaging by an appearance inspection device, or may be acquired through imaging using board camera 42 after component mounter 1 mounts a component. In a case where board 70 that is an imaging target is larger than a camera field of view of board camera 42, board camera 42 may be moved relative to board 70 to perform imaging multiple times, and image data acquired through each number of times of imaging may be combined into image data F1.

In a case where board image 170 and bottom surface component image 181 are displayed with the top surface as the upper surface, display section 64 reverses image data F1 on the up-down axis or the left-right axis to display the same. Display section 64 may display a principal portion extracted from image data F1. With this configuration, an operator can understand an actual mounted state of bottom surface component 81, and can thus dispose backup member 50 in accordance with a state of the bottom surface of board 70.

Board image 170 and bottom surface component image 181 may be images generated based on design data F2 of a board product produced through board work scheduled to be executed. Specifically, for example, in order to generate control program M2, design data F2 is generated based on part data in which an appearance of a component is included in data indicating a position and an angle of bottom surface component 81 with respect to board 70. Design data F2 may be CAD data. Acquired design data F2 is stored in storage device 61 of control device 60. With this configuration, the operator can understand an ideal mounted state of board 70 and bottom surface component 81, and can thus dispose backup member 50 in accordance with a state of the bottom surface of board 70.

Display section 64 may display top surface component image 182 indicating a component to be mounted through board work scheduled to be executed in a superimposed manner on board image 170. Consequently, the operator can understand to which region of board 70 the pressing force due to a mounting operation is applied. As long as the component type can be roughly understood from an outer shape of the top surface component image 182, the operator can easily suppose a magnitude of the pressing force and can thus set an appropriate position of backup member 50.

Display section 64 may display a feature image indicating at least one of land 171, hole 172, and reference mark 173 of board 70, and information code 174 added to board 70 in a superimposed manner on board image 170. The above-described feature image may be intended for a feature that is present on either one of the top surface and the bottom surface of board 70, or may be intended for a feature that is present on both surfaces. Consequently, the operator can understand displayed board image 170 as being similar to actual board 70. Backup member 50 can be disposed on the bottom surface without interfering with land 171 or the like.

Display section 64 may display disposition restriction region Rg for backup member 50 in which contact with backup member 50 is restricted on the bottom surface of board 70 in a superimposed manner on board image 170. The above-described disposition restriction region Rg defines a region inappropriate for the disposition of backup member 50, for example, on the assumption that a manager edits position program M1 at the site. Display section 64 may display disposition permission region Rp in addition to or instead of disposition restriction region Rg. With this configuration, it is possible to prevent backup member 50 from being erroneously disposed at an inappropriate position.

When adjustment of backup member 50 by an operator is received as described later, display section 64 displays backup member 50 in a superimposed manner on board image 170. Display section 64 may display already disposed backup member 50 and adjusted backup member 50 in an identifiable manner. Display section 64 may display backup member 50 to be displayed by a shape, a color, a character, a symbol, or a combination thereof such that the type of backup member 50 to be displayed can be identified.

4-1-3. Editing Section 65

Editing section 65 edits position program M1 in response to a request from an operator for increasing or decreasing the number of backup members 50 and for changing a position of backup member 50. Specifically, editing section 65 receives addition, removal, change of a position, change of the type, and the like of backup member 50 through an operation on a touch screen or various buttons of display device 62, or an operation on an input device. Specifically, the operator enters a position where backup member 50 is added and the type of backup member 50 in the pin information illustrated in the lower left of FIG. 5, and then presses an add button. Consequently, backup member 50 is added to the list, and added backup member 50 is displayed by display section 64 in a superimposed manner on board image 170.

Editing section 65 edits position program M1 and stores the same in storage device 61 in a case where at least one of backup members 50 is brought into a state different from the current state, or after the operator finishes work of adjusting a position of backup member 50 (for example, after an OK button is pressed). Editing section 65 prohibits editing of position program M1 in a case where the operator receives disposition of backup member 50 in disposition restriction region Rg. In this case, editing section 65 may notify the operator that at least one of backup members 50 is in disposition restriction region Rg (or not in disposition permission region Rp) to prompt the operator to change the disposition.

4-1-4. Editing Process for Position Program M1

Figure 6:
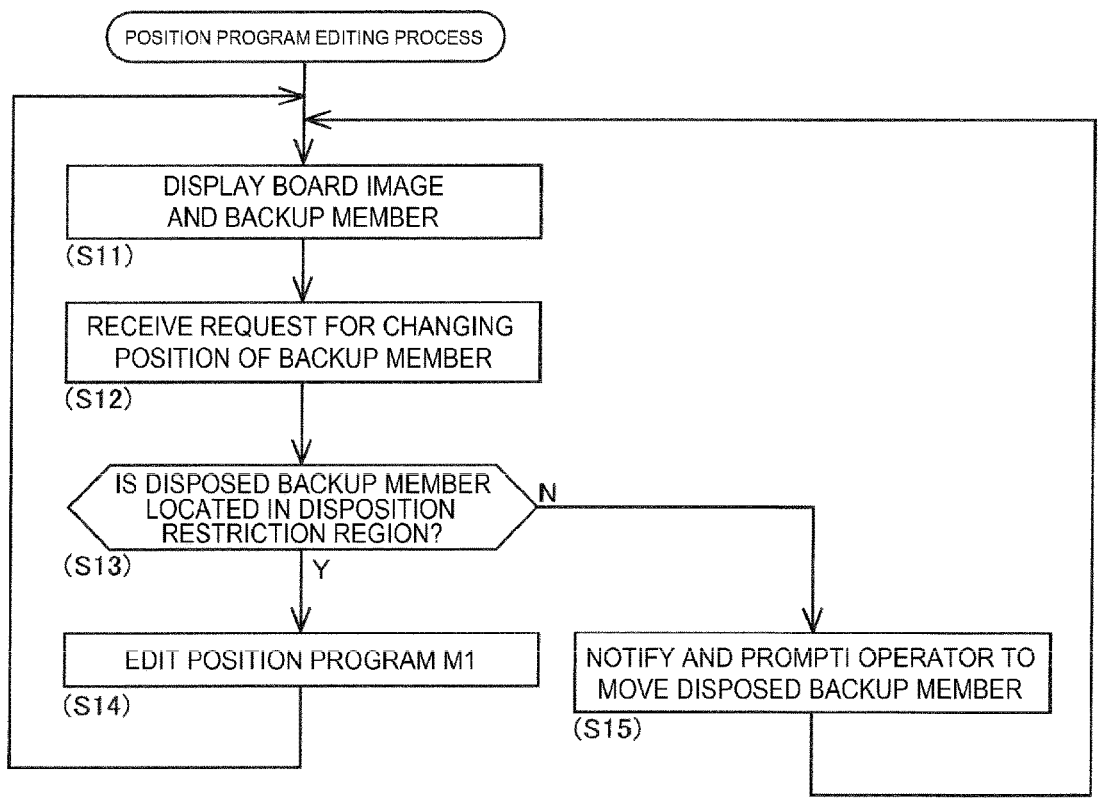
FIG. 6 is a flowchart illustrating an editing process for the position program of the first aspect.

The editing process for position program M1 will be described with reference to FIGS. 5 and 6. Component mounter 1 executes a process as illustrated in FIG. 6, for example, in a case where an operator requests adjustment of backup member 50. Here, it is assumed that an arrangement process based on position program M1 corresponding to a predetermined mounting process is already executed, and multiple predetermined mounting processes are executed. The current position of backup member 50 is stored in storage device 61 of control device 60.

As illustrated in FIG. 5, display section 64 displays on display device 62 (S11) a position (the same as the current position) of backup member 50 indicated by position program M1 in a superimposed manner on board image 170. In this case, display section 64 switches between display and non-display of each item in response to a display switching operation of the operator. Based on the tendency of results of the multiple executed mounting processes, the operator can recognize a position to which backup member 50 is to be moved on displayed board images 170 or whether backup member 50 is to be added.

Next, editing section 65 receives a request increasing or decreasing the number of backup members 50 and for changing a position of backup member 50 from the operator (S12). Subsequently, editing section 65 determines whether backup member 50 disposed in step S12 is located in disposition restriction region Rg (S13). In a case where all backup members 50 are not located in disposition restriction region Rg (S13: No), editing section 65 edits position program M1 (S14). Consequently, adjusted backup member 50 becomes a target to be displayed by display section 64 and is displayed on display device 62 (S11).

On the other hand, in a case where at least one of multiple backup members 50 is located in disposition restriction region Rg (S13: Yes), editing section 65 displays backup member 50 located in disposition restriction region Rg on display device 62 and notifies and prompts the operator to move backup member 50 (S15). Component mounter 1 repeatedly executes the processes (S11 to S15) as described above to perform reception of editing by the operator (S12 to S14) and re-display (S11).

Component mounter 1 stores edited position program M1 in storage device 61, for example, after the operator finishes the work of adjusting the position of backup member 50 by pressing the OK button in FIG. 5. When position program M1 is edited by editing section 65, movement control section 63 executes a necessary adjustment process based on a difference between a position of backup member 50 indicated by edited position program M1 and the current position of backup member 50 stored in storage device 61. The above-described adjustment process is executed, for example, when next board 70 is conveyed, or when the number of executions of the mounting processes currently executed reaches a predetermined number of times.

With this configuration, the operator can give an instruction for adjustment of backup member 50 while referring to board image 170 on which the position of backup member 50 is displayed in a superimposed manner. Therefore, component mounter 1 that is a board work machine can allow editing of position program M1 such that a process of adjusting a position of backup member 50 is appropriately executed.

4-2. Outline of Second Aspect

Here, position program M1 used in the arrangement process for backup member 50 as described above is set in advance so as to be suitable for the mounting process scheduled to be executed. However, in a case where multiple predetermined mounting processes are executed, for example, even if a similar error occurs multiple times, it is difficult to determine whether to solve the error by executing a process of adjusting a position of the backup member. In particular, since component mounter 1 performs a complicated operation by using multiple constituent devices in the mounting process, it is not easy to specify a cause of and a solution to the error.

On the other hand, in order to maintain a suitable mounting process in component mounter 1, it is desirable that the necessity of a process of adjusting a position of backup member 50 is accurately determined while coping with a variable production environment. Therefore, in the second aspect of the present embodiment, component mounter 1 employs a configuration of determining the necessity of the adjustment process for backup member 50 based on work evaluation data related to execution of board work for board 70 (for example, a component mounting process).

Figure 7:
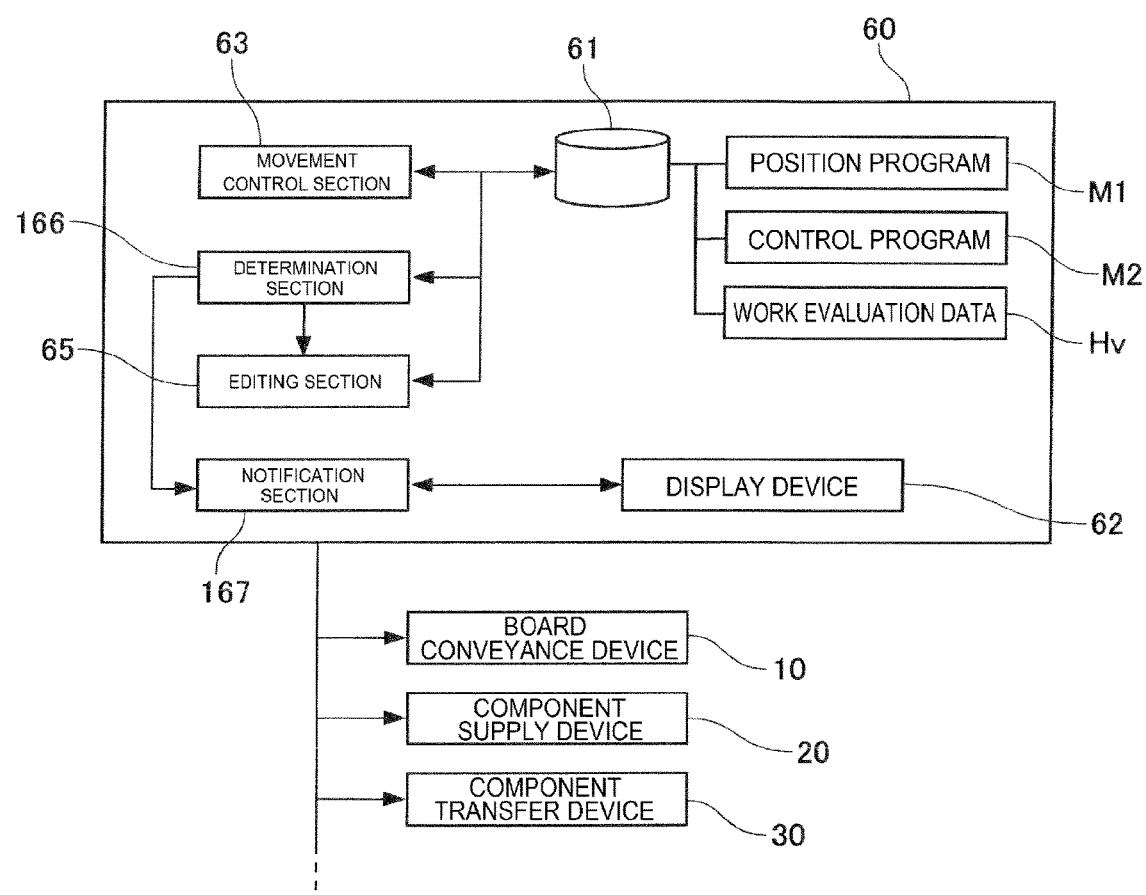
FIG. 7 is a block diagram illustrating a control device of a component mounter in a second aspect.

Specifically, as illustrated in FIG. 7, component mounter 1 includes movement control section 63, editing section 65, and determination section 166. In the second aspect, component mounter 1 further includes notification section 167. In the second aspect, movement control section 63, editing section 65, determination section 166, and notification section 167 are incorporated into control device 60. Since movement control section 63 described above is substantially the same as that in the first aspect, detailed description thereof will be omitted.

4-2-1. Determination Section 166

Determination section 166 determines whether an adjustment process including an increase or a decrease of the number of backup members 50 and a change of a position of backup member 50 is necessary based on work evaluation data Hv related to execution of predetermined board work for board 70. Here, the above-described "work evaluation data Hv" indicates work evaluation statistically calculated by aggregating the number of executions, types, errors, and the like for each piece of board work (a conveyance process, a mounting process, and the like) executed on board 70 by component mounter 1 serving as a board work machine as illustrated in FIG. 8.

Work evaluation data Hv may include statistical data Hs regarding a positioning error of board 70 with respect to a scheduled positioning position and a scheduled angle of board 70 in a conveyance process by aggregating a position and an angle of board 70 positioned in multiple executed conveyance processes. The above-described positioning error is not only an error that is regarded as an error in the conveyance process, but also an error aggregated as a deviation amount from an ideal position and angle even within a tolerance range.

Specifically, first, after a process of board conveyance device 10 conveying in board 70 is completed, one or more reference marks 173 indicating the reference of board 70 are recognized. Next, a position and an angle of board 70 in the machine are recognized based on the recognized reference marks 173. A deviation amount between a posture of board 70 that is actually positioned and an ideal posture (position and angle) is calculated as a positioning error (XY error) and an angle error. The above-described XY error and angle error are aggregated, for example, every time a conveyance process for board 70 is executed, and constitute statistical data Hs of work evaluation data Hv.

Here, backup member 50 is disposed on backup plate 16 that is not movable in the XY-directions direction with respect to base 2. Therefore, a positioning error of board 70 due to the conveyance process causes a backup position deviation of backup member 50 with respect to board 70. If the backup position deviates, there is concern that backup member 50 and bottom surface component 81 may approach each other, or backup member 50 may contact a portion of the bottom surface of board 70 that is prohibited from contact.

In view of the above-described circumstances, in a case where a positioning error of board 70 has occurred, it is desirable to execute an adjustment process for backup member 50. On the other hand, the positioning error of board 70 may have a certain tendency. For example, due to a shape of board 70, a centroid position including a component that is already mounted, a coefficient of friction of the bottom surface, or the like, board 70 is shifted or tilted in a substantially similar manner in the conveyance process. Therefore, determination section 166 determines whether the adjustment process is necessary based on the tendency of the positioning error of board 70 in statistical data Hs.

The presence or absence of the tendency of the positioning error as described above may be determined based on whether a value of a standard deviation indicating the degree of variation in the positioning error in statistical data Hs is less than a preset threshold value. Even if the variation in the positioning error in statistical data Hs is large, for example, when backup member 50 is adjusted based on an average value of the positioning error, backup is performed at a position greatly deviated from a predetermined backup position with respect to some boards 70. Therefore, in order to prevent such adjustment, it is particularly useful to perform the determination as described above.

Work evaluation data Hv may include the type and number of errors that have occurred in each of multiple zones set in board 70 in predetermined board work executed multiple times. Work evaluation data Hv may include work accuracy (for example, mounting accuracy) for each of multiple zones D1 to D4 set in board 70 in predetermined board work executed multiple times. The "multiple zones" are set to divide board 70 in a lattice shape, for example. In the second aspect, four zones D1 to D4 are set in a longitudinal direction of board 70 in consideration of bending of board 70.

Here, in a case where a frequency of occurrence of a predetermined type of error in a predetermined zone is high, or in a case where the mounting accuracy of a component is low, it is considered that backup in the predetermined zone of board 70 is insufficient. For example, there is concern that an error may occur in which board 70 is curved such that a component does not contact the top surface of board 70 during a mounting operation, or the mounting accuracy may be reduced since a sufficient pressing force cannot be applied even if the component and board 70 contact each other. In such a case, it is necessary to back up board 70 so as to correct the curving of board 70, and as a result, it is desirable to execute an adjustment process for backup member 50.

Therefore, in a case where the frequency of occurrence of a predetermined type of error in at least one target zone Dt of multiple zones D1 to D4 is higher than a prescribed value, determination section 166 determines that it is necessary to perform an adjustment process for disposing backup member 50 in a region on the bottom surface of board 70 corresponding to target zone Dt. The type of target error may be freely set within a detectable range. With this configuration, it is possible to execute or prompt a necessary adjustment process for backup member 50 based on the error having occurred. Regarding the various errors that have occurred, for example, the type and a position of an error (equivalent to a mounting position related to a mounting operation corresponding to the error) are aggregated to constitute statistical data Hs of work evaluation data Hv.

In a case where the work accuracy (mounting accuracy or the like) in at least one target zone Dt of multiple zones D1 to D4 is lower than a prescribed value, determination section 166 determines that the adjustment process for disposing backup member 50 in the region on the bottom surface of board 70 corresponding to target zone Dt is necessary. An evaluation target for the work accuracy (an XY error, an angle error, or the like) and the prescribed value may be freely set. With this configuration, it is possible to execute or prompt a necessary adjustment process for backup member 50 based on the mounting accuracy.

The mounting accuracy is aggregated based on results of inspection using board camera 42, inspection by an appearance inspection device, or the like.

Specifically, after the mounting process is executed, appearance inspection for board 70 is executed on the downstream side in the conveyance direction of board 70, and thus a deviation amount between a posture of an actually mounted component and an ideal component posture (a position and an angle) is calculated as a position error (XY error) and an angle error. In a case where no component is present at an instructed position where a component is to be mounted, it is assumed that a mounting error has occurred in a corresponding mounting operation. The XY error, the angle error, and the mounting error are aggregated, for example, every time the mounting process is executed, and constitute statistical data Hs of work evaluation data Hv.

Determination section 166 may determine whether to execute the adjustment process based on any one of various work evaluations, or may evaluate various work evaluations in a complex manner. Various work evaluations may be weighted, and the necessity of executing the adjustment process may be determined such that particularly important work evaluations are early and reliably improved. For example, with respect to an error in the mounting operation, positional adjustment of backup member 50 may also be preferentially executed from the viewpoint of production efficiency.

4-2-2. Editing Section 65

In a case where determination section 166 determines that an adjustment process is necessary, editing section 65 automatically edits position program M1 such that the adjustment process is executed. In the present embodiment, as described above, movement control section 63 executes a necessary adjustment process based on a difference between a position of backup member 50 indicated by edited position program M1 and the current position of backup member 50 stored in storage device 61. Thus, editing section 65 edits position program M1 such that the position of backup member 50 is adjusted based on a determination result from determination section 166, and stores edited position program M1 in storage device 61.

In a case where it is determined that an increase or a decrease of the number of backup members 50 and a change of a position of backup member 50 are necessary in the necessity determination, editing section 65 edits position program M1 by setting a position where backup member 50 is to be disposed on backup plate 16 based on work evaluation data Hv such that a cause of the necessity determination result is alleviated through the adjustment process. Specifically, in a case where it is determined that a process for changing a position of backup member 50 is necessary due to the tendency of a positioning error in a conveyance process for board 70, the position of backup member 50 is changed such that the tendency of the positioning error is canceled. Consequently, backup member 50 approaches a backup position in the bottom surface of board 70, which is originally scheduled, and thus more proper backup can be performed.

Here, in order to prevent an interference between backup member 50 and bottom surface component 81, board conveyance device 10 starts a process of conveying out board 70 after an operation of lifting and lowering device 17 moving down backup plate 16 to preparation height Tp is completed. Lifting and lowering device 17 moves up backup plate 16 to backup height Tb (indicated by the solid line in FIG. 2) after a process of board conveyance device 10 conveying in board 70 is completed. The time required for operating lifting and lowering device 17 is proportional to a lifting amount that is a difference between backup height Tb and preparation height Tp.

In view of the above-described circumstances, preparation height Tp of backup plate 16 can be set to be larger than a lower end height of the movable range of lifting and lowering device 17. Preparation height Tp is set according to, for example, a height of bottom surface component 81 (corresponding to a protruding amount in the Z direction downward from the lower surface of board 70). Specifically, preparation height Tp is set such that backup member 50 is retracted to a height at which the upper end of backup member 50 is located below the lower end of the highest one among bottom surface components 81.

However, according to the setting method as described above, in a case where the highest component among bottom surface components 81 is not located on a movement trajectory of backup member 50 with respect to board 70 to be conveyed, preparation height Tp is set to be excessively lower than the minimum necessary height. This is a measure for reliably preventing the interference between backup member 50 and bottom surface component 81 on the assumption that board 70 is clamped to deviate from a scheduled position or a mounting position of bottom surface component 81 is mounted to deviate from a scheduled position during positioning of board 70 by board conveyance device 10.

In contrast, as long as the tendency of a positioning error of conveyed board 70, that is, an amount or directionality of an error can be recognized, it is permissible to set preparation height Tp closer to the minimum necessary height at which the interference with bottom surface component 81 does not occur. The present embodiment employs a configuration in which preparation height Tp can be set to be larger than in the conventional art while preventing an interference between backup member 50 and bottom surface component 81. Specifically, in a case where there are multiple position candidates for increasing the number of backup members 50 or changing a position of backup member 50, editing section 65 preferentially selects a candidate having larger necessary preparation height Tp.

With this configuration, backup member 50 can be changed to a more appropriate position, and preparation height Tp can be further increased. Therefore, a difference (lifting amount) between backup height Tb and preparation height Tp can be reduced, and thus the time required for operating lifting and lowering device 17 can be reduced. As a result, it is possible to reduce the time required for production processes and thus improve the production efficiency.

4-2-3. Notification Section 167

In a case where determination section 166 determines that an adjustment process is necessary, notification section 167 notifies an operator that the adjustment process is necessary. Specifically, notification section 167 displays that the adjustment process is necessary on, for example, display device 62. In this case, notification section 167 may display work evaluation data Hv used for the determination by determination section 166 as a reason why the adjustment process is necessary. Notification section 167 may also display a recommended adjustment position of backup member 50.

Regarding the recommended adjustment position, a position of backup member 50 to be disposed on backup plate 16 may be set based on work evaluation data Hv such that, for example, a cause of the result of the determination of the necessity of the adjustment process is alleviated in the same manner as in editing section 65. In a case where determination section 166 determines that the adjustment process is required to be executed, editing section 65 may automatically edit position program M1 without notifying the operator, or may edit position program M1 after inputting the operator's instruction for executing a notification using notification section 167.

4-2-4. Editing Process for Position Program M1

Figure 9:
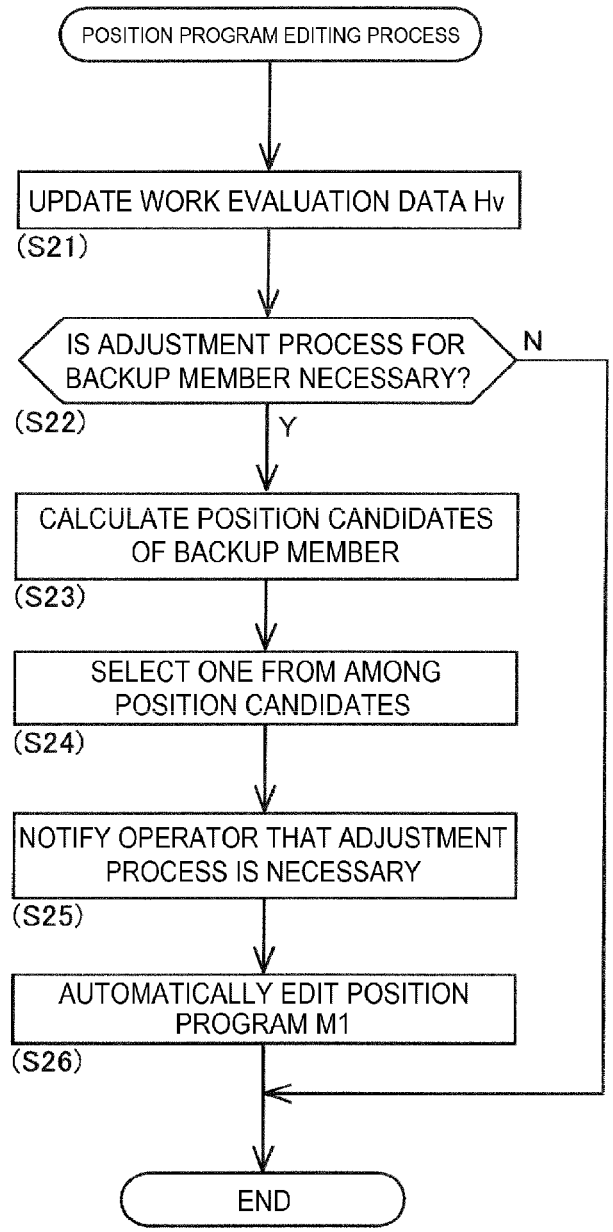
FIG. 9 is a flowchart illustrating an editing process for a position program of the second aspect.

An editing process for position program M1 will be described with reference to FIG. 9. Component mounter 1 executes a process as illustrated in FIG. 9, for example, in a case where a prescribed number of mounting processes as predetermined board work is executed. Here, it is assumed that an arrangement process based on position program M1 corresponding to a predetermined mounting process is already executed. The current position of backup member 50 is stored in storage device 61 of control device 60.

First, control device 60 updates work evaluation data Hv based on various data acquired by executing board work such as a conveyance process for board 70 and a component mounting process (S21). In this case, control device 60 aggregates the number of executions, types, errors, and the like of executed board work, and indicates a work evaluation statistically calculated. Control device 60 also updates statistical data Hs for a positioning error of board 70 in the same manner.

Determination section 166 determines whether the adjustment process for backup member 50 is necessary based on work evaluation data Hv (S22). Specifically, determination section 166 determines whether the adjustment process is necessary based on whether a positioning error that tends to be constant occurs in a conveyance process for board 70, whether an error occurs at a predetermined frequency in any of multiple zones D1 to D4 in the mounting process, and whether the mounting accuracy is reduced in any of multiple zones D1 to D4 in the mounting process.

In a case where it is determined that the adjustment process for backup member 50 is necessary (S22: Yes), editing section 65 calculates position candidates of backup member 50 (S23). In this case, editing section 65 calculates a position where backup member 50 is to be disposed on backup plate 16 such that a cause of the result of the determination of the necessity of the adjustment process in S22 is alleviated. Specifically, for example, in a case where a predetermined type of error occurs at a predetermined frequency in any one of multiple zones D1 to D4, editing section 65 designates the zone as target zone Dt, and disposes backup member 50 in a region on the bottom surface of board 70 corresponding to target zone Dt. Editing section 65 calculates one or more position candidates in consideration of a state of bottom surface component 81, a position of a top surface component scheduled to be mounted, or the like.

In a case where two or more position candidates are calculated in S23, editing section 65 selects one position candidate based on, for example, a preset priority (S24). For example, in a case where preparation height Tp is set to be larger as the priority, editing section 65 preferentially selects a candidate having larger necessary preparation height Tp from among multiple position candidates. In a case where there is one position candidate calculated in S23, editing section 65 omits the position candidate selection process (S24).

Subsequently, notification section 167 notifies the operator that the adjustment process is necessary (S25). Specifically, notification section 167 displays that the adjustment process for backup member 50 is necessary on display device 62. Notification section 167 may appropriately display the reason why the adjustment process is necessary, the current position of backup member 50, an image of board 70, one or more position candidates, and a recommended adjustment position of backup member 50 (the position candidate selected in S24).

In step S26, editing section 65 automatically edits position program M1 such that the position of backup member 50 is adjusted. Specifically, editing section 65 edits position program M1 based on the position candidate selected in S24, and stores edited position program M1 in storage device 61. When position program M1 is edited by editing section 65, movement control section 63 executes a necessary adjustment process based on a difference between a position of backup member 50 indicated by edited position program M1 and the current position of backup member 50 stored in storage device 61. The above-described adjustment process is executed, for example, when next board 70 is conveyed, or when the number of executions of the mounting processes currently executed reaches a predetermined number of times.

With this configuration, it is possible to determine whether the adjustment process of the position of backup member 50 is necessary based on work evaluation data Hv relating to the execution of component mounter 1 that is the board work. Consequently, it is possible to reliably execute necessary adjustment process, and it is possible to improve the accuracy and efficiency of the board work, such as the conveyance process of board 70 and the mounting process of the components. It is possible to prevent an unnecessary adjustment process from being executed and thus to prevent degradation in productivity.

4-3. Outline of Third Aspect

As described above, from the viewpoint of an operator's convenience at the site or the maintenance of productivity, it is desirable that position adjustment of backup member 50 is permitted in accordance with a request from the operator. Even in a case where there is no request from the operator, in order to maintain a suitable mounting process in component mounter 1, it is desirable to accurately determine whether a process of adjusting a position of backup member 50 is necessary while coping with a variable production environment.

Figure 10:
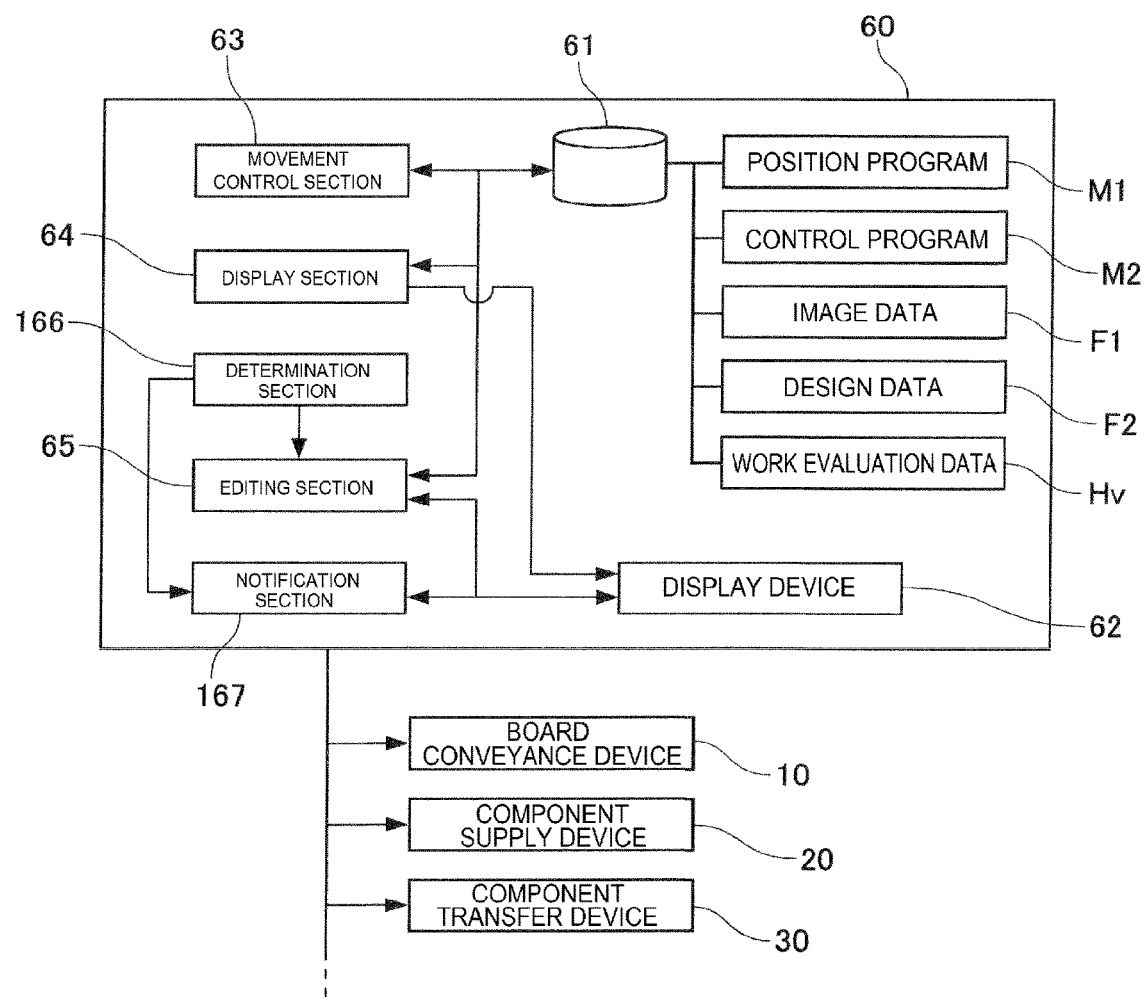
FIG. 10 is a block diagram illustrating a control device of a component mounter in a third aspect.

Therefore, in the third aspect of the present embodiment, component mounter 1 employs a configuration of receiving editing of position program M1 (adjustment of a position of backup member 50) on the premise that predetermined information is displayed to the operator. Component mounter 1 employs a configuration of determining the necessity of the adjustment process for backup member 50 based on work evaluation data related to execution of board work for board 70 (for example, a component mounting process). Specifically, as illustrated in FIG. 10, component mounter 1 includes movement control section 63, display section 64, editing section 65, and determination section

166. In the third aspect, component mounter 1 further includes notification section 167.

In the third aspect, movement control section 63, display section 64, editing section 65, determination section 166, and notification section 167 are incorporated into control device 60. Since each of the above-described sections 63 to 65, 166, and 167 is substantially the same as that in the first aspect and the second aspect, detailed description thereof will be omitted. Component mounter 1 according to the third aspect receives editing of position program M1 by an operator, and automatically edits position program M1 based on work evaluation data Hv. With this configuration, the same effects as those of the first aspect and the second aspect can be achieved.

5. Modification Aspects of Embodiment 5-1. Backup Member 50

In the embodiment, backup member 50 is assumed to be hard pin 51 or soft pin 52. On the other hand, various aspects may be employed as backup member 50. Specifically, backup member 50 may include multiple support portions that contact the lower surface of board 70 to support board 70. In addition to having an engagement portion as exemplified in the embodiment, the supported portion supported by the holding member may be formed in one or more planar shapes. Such a holding member is held through suction pickup by the suction nozzle 34 serving as a holding member.

5-2. Board Work Machine

In the above embodiment, the board work machine has been described as component mounter 1 that mounts components on board 70. In contrast, the configuration capable of allowing editing of the position program exemplified in the first aspect or the configuration capable of determining the necessity of a process of adjusting a position of the backup member exemplified in the second aspect may be applied to a configuration of supporting board 70 by using backup member 50 during execution of predetermined board work among various board work machines. Specifically, the board work machine may be a printing machine that prints solder on board 70. In a board work machine such as component mounter 1 or the printing machine, the movement device moving backup member 50 may be a dedicated device disposed in each machine.

5-3. Others

In the embodiment, each of movement control section 63, display section 64, editing section 65, determination section 166, and notification section 167 is configured to be incorporated into control device 60. On the other hand, at least a part of the above-described sections 63 to 65, 166, and 167 may be provided outside control device 60. For example, at least a part of the above-described sections 63 to 65, 166, and 167 may be configured to be incorporated into a host computer or a dedicated external device capable of communicating with the board work machine. Therefore, various data M1, M2, F1, F2, Hv, and Hs are also stored in an accessible storage device.

REFERENCE SIGNS LIST

1: Component mounter (board work machine), 10: Board conveyance device, 15: Backup device, 16: Backup plate, 30: Component transfer device (movement device), 50: Backup member, 60: Control device, 61: Storage device, 62: Display device, 63: Movement control section, 64: Display section, 65: Editing section, 166: Determination section, 167: Notification section, 70: Board, 81: Bottom surface component, 170: Board image, 171: Land (feature image), 172: Hole (feature image), 173: Reference mark (feature image), 174: Information code (feature image), 181: Bottom surface component image, 182: Top surface component image, P1 to P4: Backup position, Rg: Disposition restriction region, Rp: Disposition permission region, M1: Position program, M2: Control program, F1: Image data, F2: Design data, Hv: Work evaluation data, Hs: Statistical data, D1 to D4: (Multiple) zones, Dt: Target zone, Tb: Backup height, Tp: Preparation height

The invention claimed is:

1. A board work machine comprising:
    a backup plate;
    a backup member disposed on the backup plate to support a board from below;
    a movement device configured to move the backup member;
    a movement control section configured to control an operation of the movement device based on a position program indicating a position of the backup member disposed on the backup plate;
    a display section configured to display the position of the backup member indicated by the position program in a superimposed manner on a board image indicating the board;
    a determination section configured to determine whether an adjustment process including an increase or a decrease of a number of the backup members and a change of the position of the backup member is necessary based on work evaluation data related to execution of predetermined board work on the board; and
    an editing section configured to edit the position program in response to the adjustment process for increasing or decreasing a number of the backup members and changing the position of the backup member from an operator
    wherein the work evaluation data includes statistical data regarding a positioning error of the board with respect to a scheduled positioning position and a scheduled angle of the board.

2. The board work machine according to claim 1, wherein the display section displays a bottom surface component image indicating a component mounted on a bottom surface of the board in a superimposed manner on the board image.

3. The board work machine according to claim 2, wherein the board image and the bottom surface component image are images generated based on image data acquired by imaging the board after the component is mounted on the board.

4. The board work machine according to claim 2, wherein the board image and the bottom surface component image are images generated based on design data of a board product that is produced through board work scheduled to be executed.

5. The board work machine according to claim 2, wherein the display section displays a height of the component mounted on the bottom surface of the board on the board image with at least one of a numerical value, a color, and a pattern.

6. The board work machine according to claim 1, wherein the display section displays a top surface component image indicating a component that is mounted through board work scheduled to be executed in a superimposed manner on the board image.

7. The board work machine according to claim 1, wherein the display section displays a feature image indicating at least one of a land, a hole, and a reference mark of the board, and an information code added to the board in a superimposed manner on the board image.

8. The board work machine according to claim 1, wherein the display section displays a disposition restriction region for the backup member in which contact with the backup member is restricted on a bottom surface of the board in a superimposed manner on the board image, and the editing section prohibits editing of the position program in a case where a request for disposing the backup member in the disposition restriction region is received from the operator.

9. The board work machine according to claim 1, further comprising:

a board conveyance device configured to execute a conveyance process of conveying the board into the machine and positioning the board, and conveying the board out from the machine after executing the board work, wherein the statistical data regarding the positioning error of the board is determined by aggregating a position and an angle of the board positioned in the conveyance process executed multiple times, and the determination section determines whether the adjustment process is necessary based on a tendency of the positioning error of the board in the statistical data.

10. The board work machine according to claim 1, wherein the work evaluation data includes a type of error and the number of errors that have occurred in each of multiple zones set on the board in the predetermined board work executed multiple times, and in a case where a frequency of occurrence of the errors of a predetermined type in at least one target zone among the multiple zones is higher than a prescribed value, the determination section determines that the adjustment process of disposing the backup member in a region of a bottom surface of the board corresponding to the target zone is necessary.

11. The board work machine according to claim 1, wherein the work evaluation data includes a work accuracy for each of multiple zones set on the board in the predetermined board work executed multiple times, and in a case where the work accuracy in at least one target zone among the multiple zones is less than a prescribed value, the determination section determines that the adjustment process of disposing the backup member in a region of a bottom surface of the board corresponding to the target zone is necessary.

12. The board work machine according to claim 1, wherein the editing section is configured to automatically edit the position program such that the adjustment process is executed in a case where the determination section determines that the adjustment process is necessary.

13. The board work machine according to claim 12, wherein in a case where it is determined that the increase or the decrease of the number of backup members and the change of the position of the backup member are necessary in the determination of necessity by the determination section, the editing section sets a position of the backup member to be disposed on the backup plate based on the work evaluation data such that a cause of a result of the determination of the necessity is alleviated through the adjustment process, and then edits the position program.

14. The board work machine according to claim 12, further comprising:

a board conveyance device configured to execute a conveyance process of conveying the board into the machine and positioning the board, and conveying the board out from the machine after executing board work; and a lifting and lowering device configured to retract the backup member downward from a bottom surface of the board when the board is conveyed in or out to move down the backup plate to a preparation height at which a component mounted on the bottom surface of the board does not interfere with the backup member, wherein in a case where there are multiple position candidates in the increase of the number of the backup members or the change of the position of the backup member, the editing section preferentially selects a position candidate of which the necessary preparation height is larger.

15. The board work machine according to claim 1, further comprising:

a notification section configured to notify the operator that the adjustment process is necessary in a case where the determination section determines that the adjustment process is necessary.

16. The board work machine according to claim 1, wherein the board work machine is a component mounter configured to mount a component on the board, the movement device includes a head driving device configured to move a moving table in a horizontal direction, and a mounting head provided on the moving table and configured to hold the component and the backup member.

* * * * *